United States Patent [19]

Ebbesen et al.

[11] Patent Number: 5,626,812
[45] Date of Patent: May 6, 1997

[54] METHOD OF PRODUCING CARBON MATERIAL BY BENDING AT LEAST ONE CARBON ATOM LAYER OF GRAPHITE

[75] Inventors: Thomas Ebbesen; Hidefumi Hiura; Katsumi Tanigaki, all of Tokyo, Japan

[73] Assignee: NEC Corporation, Tokyo, Japan

[21] Appl. No.: 465,427

[22] Filed: Jun. 5, 1995

Related U.S. Application Data

[62] Division of Ser. No. 202,061, Feb. 25, 1994, abandoned.

[30] Foreign Application Priority Data

Feb. 26, 1993 [JP] Japan .................................. 5-037701

[51] Int. Cl.$^6$ ..................... B29C 53/04; B29C 53/36; C01B 31/02; C01B 31/04
[52] U.S. Cl. ................ 264/248; 250/492.3; 264/285; 264/339; 423/445 R; 423/45 B; 423/448
[58] Field of Search .............. 423/445 B, 445 R, 423/448; 250/492.3; 264/248, 285, 339

[56] References Cited

U.S. PATENT DOCUMENTS

| | | | |
|---|---|---|---|
| 4,987,312 | 1/1991 | Eigler | 250/492.3 |
| 5,015,323 | 5/1991 | Gallagher | 250/492.3 X |
| 5,110,577 | 5/1992 | Tamor et al. | 423/445 R |
| 5,138,174 | 8/1992 | Tang | 250/492.3 |
| 5,144,148 | 9/1992 | Eigler | 250/492.3 |
| 5,343,042 | 8/1994 | Fuchs et al. | 250/492.3 X |
| 5,359,199 | 10/1994 | Fuchs et al. | 250/492.3 |
| 5,365,073 | 11/1994 | White | 250/492.3 |
| 5,401,975 | 3/1995 | Ihara et al. | 250/492.3 |
| 5,457,343 | 10/1995 | Ajayan et al. | 423/447.2 X |
| 5,489,477 | 2/1996 | Ohta et al. | 423/445 B X |

FOREIGN PATENT DOCUMENTS 0527379  2/1993  European Pat. Off. .

OTHER PUBLICATIONS

H. Hiura et al., "Role of Sp$^3$ Defect Structures in Graphite and Carbon Nanotubes", *Nature*, vol. 367, 13 Jan. 1994, pp. 148–151.

T. W. Ebbesen, "Nanotube Properties & Graphite Origami", *Progress in Fullerene Research*, Kirchberg, Tyrol, Austria 5–12 Mar. 1994, pp. 116–121.

Iijima, Sumio, "Helical microtubules of graphitic carbon", *Nature*, vol. 354, 7 Nov. 1991, pp. 56–58.

Peterson, I., "Wrapping cabon into superstrong tubes", *Science News*, vol. 143, 1993, p. 214.

Albrecht, T.R., et al., "Nanometer-scale hole formation on graphite using a scanning tunneling microscope", *Applied Physics Letters*, vol. 55, No. 17, 23 Oct. 1989, pp. 1727–1729.

(List continued on next page.)

*Primary Examiner*—Adrienne C. Johnstone
*Attorney, Agent, or Firm*—Sughrue, Mion, Zinn, Macpeak & Seas

[57] ABSTRACT

A novel carbon material is obtained by bending at least one carbon atom layer of graphite in at least one selected region along either, or both, of lines I and II in FIG. 1. The bending can be accomplished by scanningly picking the carbon atom layer(s) with a probe of an atomic force microscope or another scanning microscope. The obtained carbon material has at least one round bend having a width of 0.1–10 nm and at least one flap region having a triangular, rectangular or still differently polygonal shape in plan view. When the carbon atom layer(s) is bent with very small radii of curvature, a finely striped ridge-and-groove structure appears in the round bend. The physical properties of the obtained carbon material are uniquely determined by the direction(s) of bending, width of each bend, shape and size of each flap region and the stripe pitch of the ridge-and-groove structure.

6 Claims, 8 Drawing Sheets

OTHER PUBLICATIONS

Baselt, D.R., et al., "Lateral forces during atomic force microscopy of graphite in air", *Journal of Vacuum Science & Technology*, B, vol. 10, No. 5, Sep./Oct., 1992, pp. 2316–2322.

Ge, Maohui, et al., "Vapor–Condensation Generation and STM Analysis of Fullerene Tubes", *Science*, vol. 260, 23 Apr. 1993, pp. 515–518.

Ugarte, Daniel, "Curling and Closure of Graphitic Networks Under Electron–Beam Irradiation", *Nature*, vol. 359, 22 Oct. 1992, pp. 707–709.

METHOD OF PRODUCING CARBON MATERIAL BY BENDING AT LEAST ONE CARBON ATOM LAYER OF GRAPHITE

This is a divisional of application Ser. No. 08/202,061 filed Feb. 25, 1994 now abandoned.

BACKGROUND OF THE INVENTION

This invention relates to a novel carbon material, which is obtained by working graphite on the atomic level and can have various shapes and uniquely determined physical properties, and a method of producing the novel carbon material. This carbon material has latent possibilities of wide uses in the next generation industries and particularly in the microelectronic and microoptoelectronic industries.

Well known carbon materials are carbon black, amorphous carbon, glassy carbon, graphite and diamond. The uses of carbon black, amorphous carbon and glassy carbon are limited because these carbon materials have no definite structure. Graphite has a layer structure consisting of regularly stacked uniplanar layers of hexagonally arranged carbon atoms and hence exhibits two-dimensional conductivities. Diamond has a three-dimensional network structure consisting of tetrahedrally arranged carbon atoms. Although the structures and physical properties of graphite and diamond are well known, it is difficult to utilize these carbon materials in electronic devices because there is no method of forming microstructures of graphite or diamond.

A recently discovered carbon material is $C_{60}$ which is a spherical assembly of carbon atoms. $C_{60}$ exhibits various properties including semiconductivity, conductivity and superconductivity in accordance with its electron structures which are attributed to its symmetries. However, for practical uses of $C_{60}$ there is an unsolved problem that variously desired crystals cannot easily be produced.

A more recent discovery is the formation of carbon nanotubes, first disclosed in Nature, Vol. 354(1991), 56–58. A carbon nanotube is made up of a plurality of coaxially nested rolls of graphite sheets each of which has a thickness of several carbon atom layers. The outer diameter of a carbon nanotube is only a few to tens of nanometers, and the length is usually shorter than 10 μm. Carbon nanotubes attracted worldwide attention in view of the possibilities of using as one-dimensionally conducting wires or catalysts or in superreinforced structures. A particularly attractive feature of a carbon nanotube is that the electrical property of each of the nested carbon tubes depends on the tube diameter and the pitch of a helical arrangement of carbon atom hexagons in the rolled graphite sheets and is variable from a metallic conductor to semiconductors with various band gaps. It is intended to use carbon nanotubes as quantum wires, but at present practical use encounters some problems. Carbon nanotubes are always cylindrical, and there is no expectation that carbon nanotubes of a different sectional shape will be produced. Besides, the products of the known methods are always mixtures of nanotubes of various sizes. Although the electrical property of a carbon nanotube strongly depends on its diameter and length, still it is impossible to produce carbon nanotubes with desired diameters and lengths on the order of nanometer.

SUMMARY OF THE INVENTION

It is an object of the present invention to provide a novel carbon material which can be obtained in variously desired shapes of desired sizes on the order of nanometer and exhibits definite physical properties.

It is another object of the invention to provide a method of producing the novel carbon material.

A carbon material according to the invention is a modification of graphite and is characterized in that at least one carbon atom layer of graphite is bent in at least one selected region along at least one of a first line which extends generally in the direction of a straight line connecting the middle points of two parallel sides of a hexagonal ring of carbon atoms and contains two adjacent sides of the hexagonal ring forming an angle of 30° with the aforementioned straight line and a second line which extends generally in the direction of a diagonal of the hexagonal ring and contains three adjacent side of the hexagonal ring on one side of the diagonal.

A method of producing the above stated carbon material is characterized by bending at least one carbon atom layer of graphite by scanningly picking the carbon atom layer(s) with a needle which is sharply pointed on the atomic level.

In practice it is convenient to use a probe of a scanning microscope as the aforementioned needle.

A carbon material according to the invention has at least one bend which is round and has a width ranging from about 0.1 nm to about 1 nm. The physical properties of the carbon material depends on both the direction of bending and the bend width. When a carbon atom layer is bent with small radii of curvature a finely striped ridge-and-groove structure appears in the round bend, and in that case the physical properties of the carbon material depends on the stripe pitch of the ridge-and-groove structure. Usually the bending is made so as to form a flap region having a polygonal shape in plan view, and the physical properties of the carbon material depends on the shape and size of the flap.

It is a very favorable feature of the carbon material according to the invention that the physical properties of the material are uniquely determined when the structural configuration of the material is specified.

According to the invention a carbon material having uniquely determined physical properties, including electrical properties, can be obtained by bending a carbon atom layer in a suitable direction so as to form a specific shape. From another aspect, a carbon material according to the invention can exhibit variously desired shapes which are on the order of nanometer in size. In general, quantum size effect appears when a material forms a microstructure of a size on the atomic level. Therefore, the possibility of forming graphite structures of ultrafine and intricate shapes leads to the possibility of producing novel electronic devices using quantum size effect. Carbon materials according to the invention can be used, for example, in parts of submicrometer structures, wires in microelectronic devices and microcircuits, quantum devices and various electrodes.

DETAILED DESCRIPTION OF THE INVENTION

Figure 1:
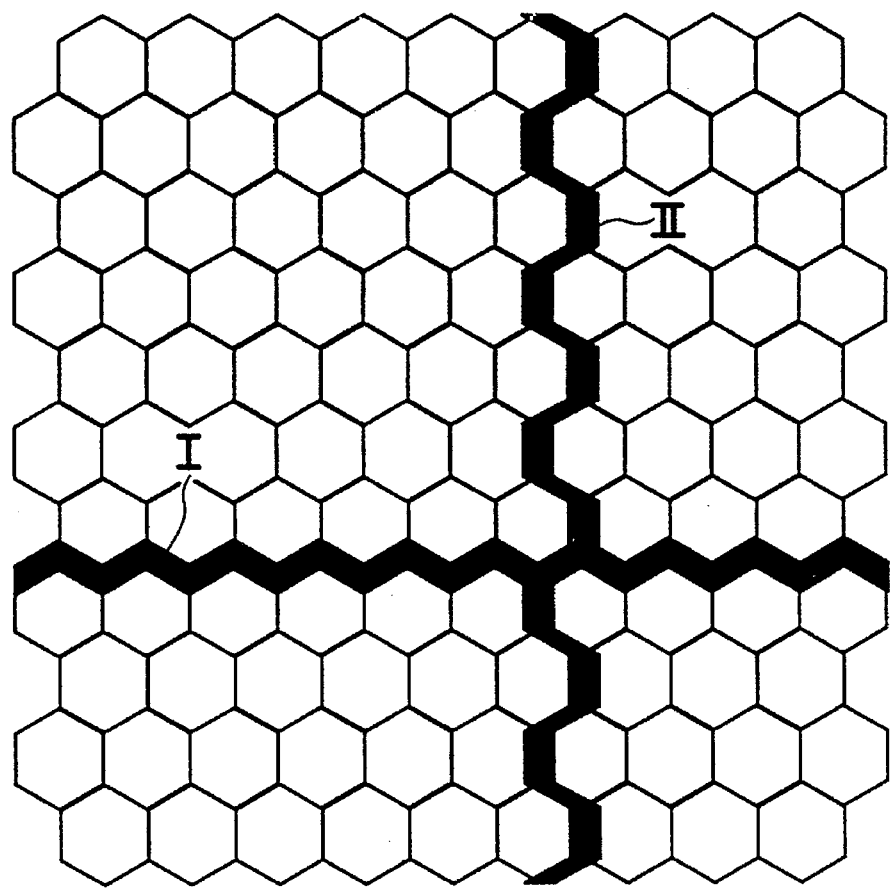
FIG. 1 is an illustration of the hexagonal network of carbon atoms in a planar layer of graphite crystal and shows two lines along either of which the planar layer can be bent.

FIG. 1 illustrates the carbon atom network in a planar layer of graphite crystal. The gist of the invention is to bend this carbon atom layer along either, or both, of two heavy lines I and II. Line I extends generally in the direction of a straight line connecting the middle points of two parallel sides of a hexagonal ring of carbon atoms. In other words, line I extends generally in the [1120] direction in the plane of the graphite layer. Accurately, line I is a regularly broken line containing two adjacent sides of the hexagon forming an angle of 30° with the aforementioned straight line. Line II extends generally in the direction of a diagonal of a hexagonal ring of carbon atoms. In other words, line II extends generally in the [1010] direction. Accurately, line II is a regularly broken line containing three adjacent sides of the hexagon on one side of the diagonal.

In this invention the carbon atom layer of graphite is bent along either line I or line II in at least one belt-like region having a width of from about 0.1 nm to about 10 nm. In each bend region the carbon atom layer roundly bulges as is seen when an edge of a carpet is get turned up.

We have discovered a fact that when a carbon atom layer of graphite is turned over the layer bends always along either, or both, of the above described two lines I and II. The same result is brought about when two or three layers are simultaneously turned over. The present invention utilizes this fact.

Figure 2:
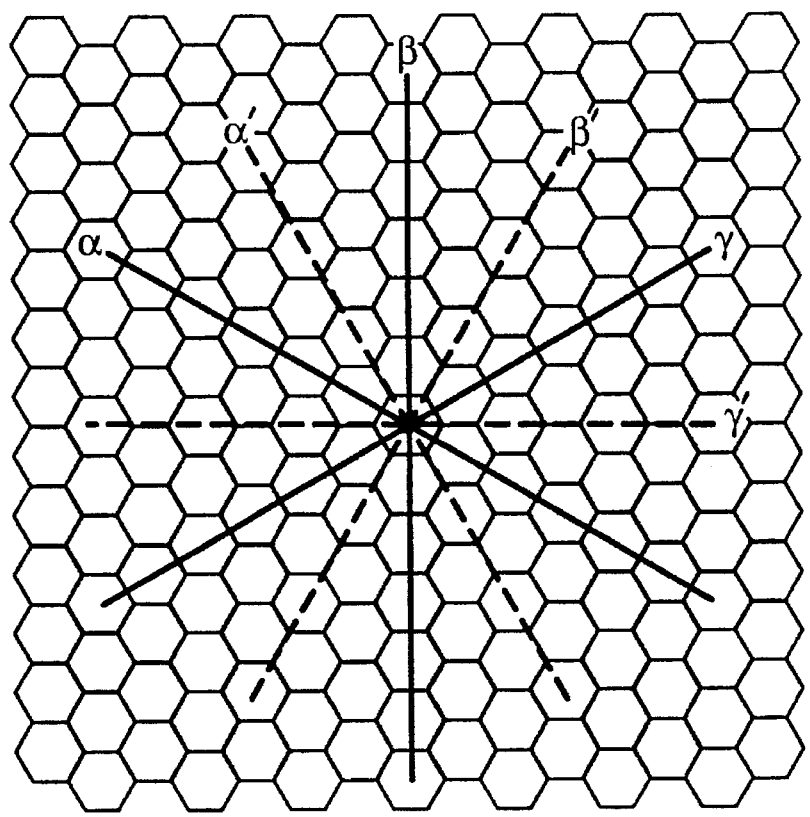
FIG. 2 is also an illustration of the same network and shows the directions of six axes of symmetry of the network.

Referring to FIG. 2, the hexagonal network in a carbon atom layer of graphite has three equivalent axes of symmetry α, β and γ which form an angle of 60° with each other and another three equivalent axes α', β' and γ' which form an angle of 30° with the three axes α, β and γ, respectively, and an angle of 60° with each other. The bending line I in FIG. 1 extends in the direction of any of the three equivalent axes α, β and γ and the bending line II in the direction of any of the three equivalent axes α', β' and γ'. It is a fact that the carbon atom layer can be cut most easily in the directions of the axes α, β and γ and in the next place in the directions of the axes α', β' and γ'.

In producing a carbon material according to the invention, usually it is necessary to make cuts in a carbon layer of graphite before bending that layer. The carbon atom layer can be cut and bent by using a probe of a scanning microscope. In general the probe of a scanning microscope is a tiny needle of, for example, tungsten, silicon or silicon carbide having a sharply pointed tip with a radius of curvature ranging from few nanometers to tens of nanometers. By scanning a specimen surface with a suitable probe it is possible to obtain a microscope image of a few nanometers to a few micrometers square area. In this invention a graphite surface is scanned with such a probe to accomplish cutting and bending of a carbon atom layer of graphite in a desired area which can be observed in the microscope image. The arrangement of the cuts and the width of each belt-like bend region are determined by the ranges of scanning, and cutting and bending are performed by suitably adjusting the pressure applied to the probe or the distance between the probe and the graphite surface. In the following examples a probe of an atomic force microscope (AFM) is used, but it is possible to alternatively use any other probe in the form of suitably tiny needle. Alternative to AFM it is possible to use a scanning tunneling microscope (STM) or a still different kind of scanning microscope.

EXAMPLE 1

Figure 3A:
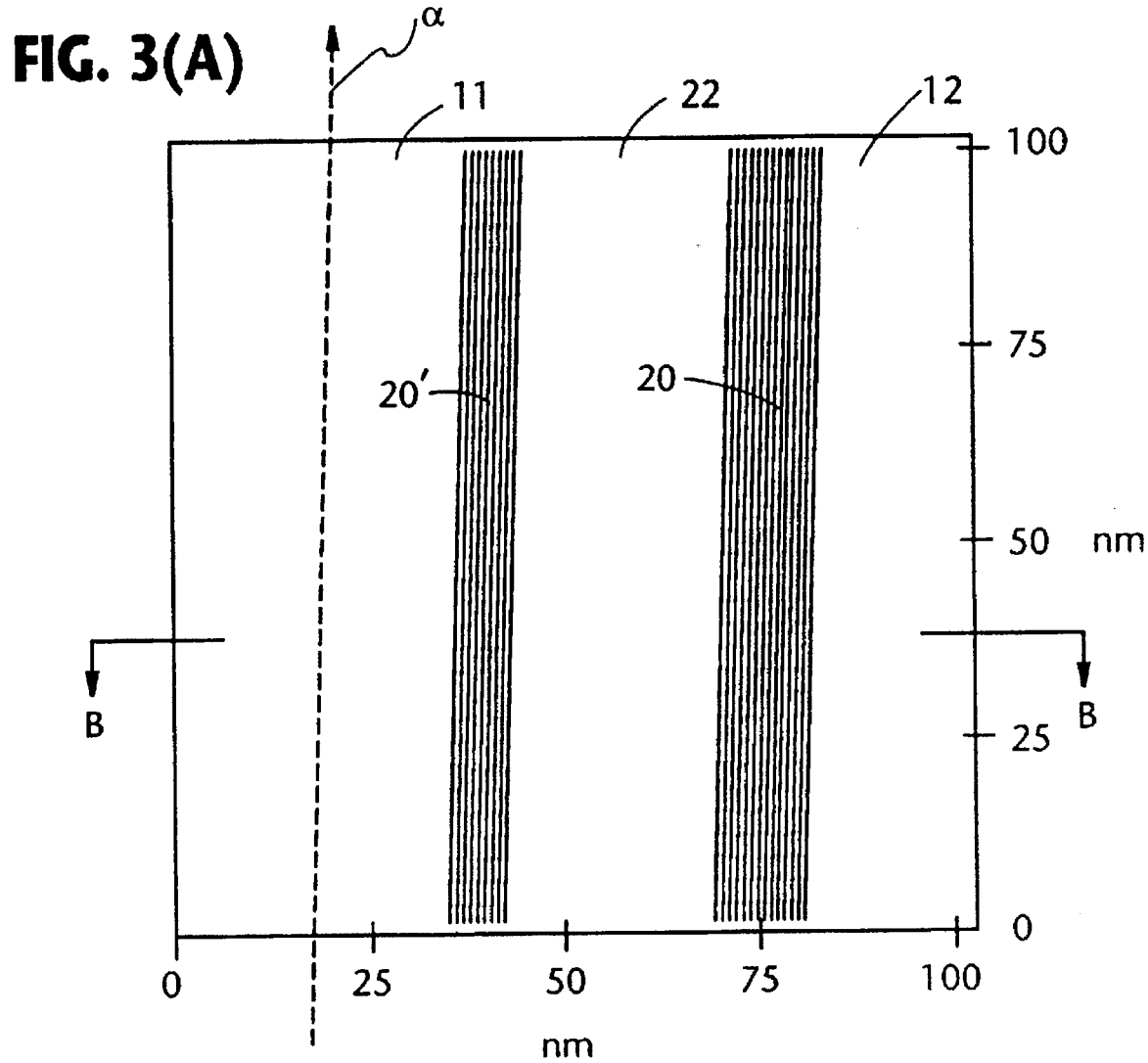
FIG. 3(A) is a magnified plan view sketch of a novel carbon material produced by bending a carbon atom layer of graphite.
Figure 3B:
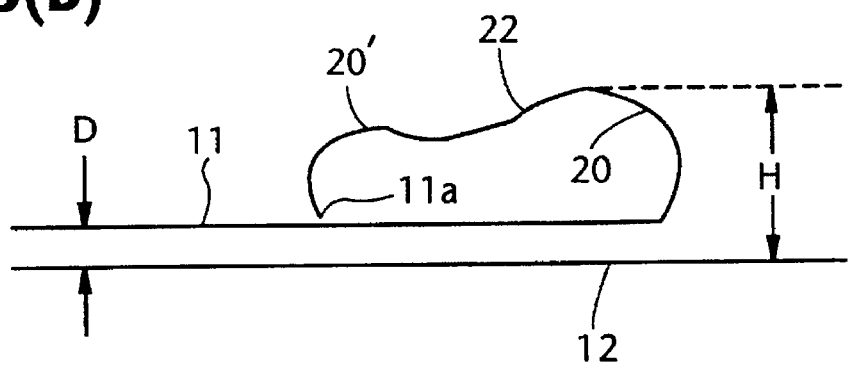
FIG. 3(B) is a sketch of the section taken along the line B—B in FIG. 3(A)

A carbon atom layer (the surface layer) of graphite was cut and bent by using a probe of AFM, and the structure of the obtained novel carbon material was observed with AFM. FIG. 3(A) is a sketch of an AFM image of the obtained carbon material, and FIG. 3(B) shows an elevational section. Numeral 11 indicates the carbon atom layer on the surface and numeral 12 the next carbon atom layer.

The carbon atom layer 11 is cut so as to define a rectangular area having an edge 11a parallel to the axis α (or β or γ) of symmetry shown in FIG. 2. For the cutting operation of AFM the set-point voltage of the probe (which corresponds to the probe pressure) is controlled to 6–10 V (for ordinary observation purposes the set-point voltage is 0–3 V), and the Z-center voltage (which determines the amount of a descending or ascending movement of the probe) is gradually increased until the probe comes into sure contact with the graphite surface 11. The scanning rate is extremely lowered to 1 Hz or below (5–20 Hz for ordinary observation purposes). The length of each cut in the surface layer 11 of graphite agrees with a scanning distance.

For the bending operation the set-point voltage of the probe is returned to the normal level of 0–3 V. If the probe comes apart from the graphite surface 11 the Z-center voltage is readjusted to restore the contact of the probe with the graphite surface. Then the direction of scanning with the probe is made perpendicular to the edge 11a by adjusting the rotation angle. The rotation angle can be changed by manipulation of the controller of AFM to change the direction of the piezoelectric element driving the AFM. In the bending operation the scanning rate is controlled to about 2 Hz.

The carbon atom layer 11 was bent in a belt-like region 20 parallel to the edge 11a so as to form a rectangular flap 22. As a result the belt-like region 20 turned into a roundly bulging bend region. Furthermore, the rectangular flap 22 was bent in another belt-like region parallel to the edge 11a to produce a roundly bulging bend region 20'. The height H of the bulging bend region 20 was about 1 nm. The distance D between the planar region of the locally bent layer 11 and the graphite surface (12) exposed by bending the layer 11 was about 0.34 nm. Since the spacing between two adjacent layers of graphite crystal is 0.34 nm it is certain that in this example only one layer of graphite crystal was bent. By observation of atomic images of the bent layer 11 it was confirmed that the bends 20 and 20' extend in the direction of the axis α (or β or γ). That is, the carbon atom layer 11 was bent along the line I in FIG. 1.

The carbon material produced in this example can be regarded as having one-dimensionally extending microstructures, which are analogous to quantum wires, on a graphite plane. In these microstructures (20, 20') band gaps differ with the directions of bending and the widths of the microstructures. Therefore, it is possible to selectively afford dielectricity, semiconductivity or metallic conductivity to these microstructures and utilize such a property for application of the novel carbon material to, for example, quantum devices.

EXAMPLE 2

When a carbon atom layer of graphite is bent along any of the six axes shown in FIG. 2 with very small radii of curvature, viz. radii smaller than about 10 nm, a finely striped ridge-and-groove structure appears in the bend region for relaxation of strains.

Figure 4A:
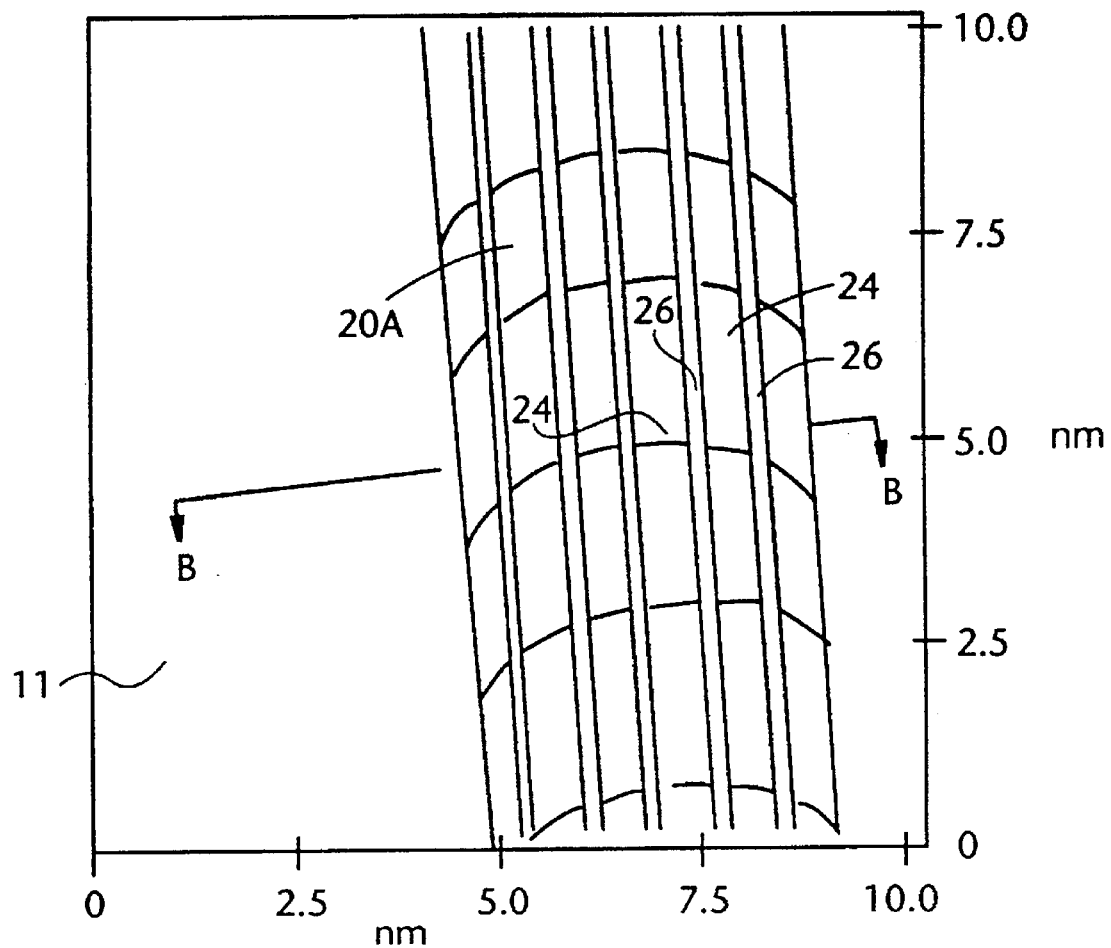
FIG. 4(A) is a magnified plan view sketch of a ridge-and-groove structure in a carbon material according to the invention and FIG. 4(B) is a sketch of the section taken along the line B—B in FIG. 4(A)
Figure 4B:
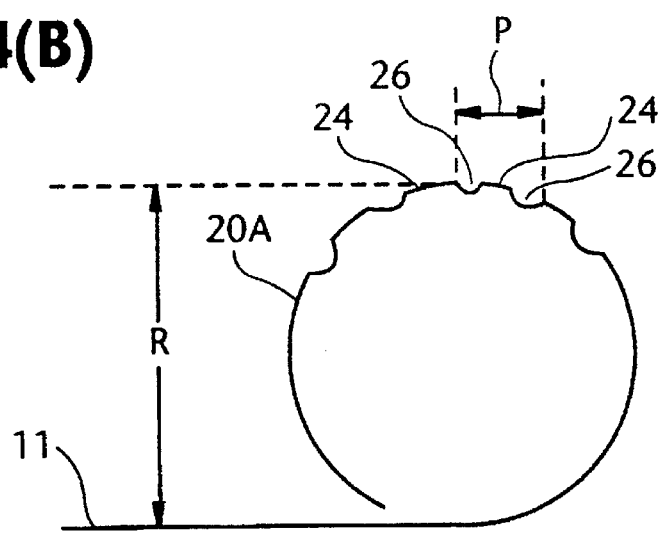

A ridge-and-groove structure produced in this example is shown in FIG. 4(A), which is a sketch of an AFM image, and FIG. 4(B) which is a sketch of an elevational section.

Using a probe of AFM, carbon atom layer 11 on the surface of graphite was cut and bent along the axis α in FIG. 2 so as to form a nearly cylindrical bend region 20A having a diameter R of about 5 nm. In this bending operation the set-point voltage of the probe was regulated to 3–6 V (which was higher than the voltage in the bending operation in Example 1), and the scanning rate was slightly increased to about 3 Hz. In this case the amount of bulging of the bend region became very small. In the resulting bend region 20A there were ridges 24 and grooves 26 in an alternately striped pattern. The pitch P of the striped ridges 24 and grooves 26 was about 1 nm, and the depth of the grooves 26 from the top of the ridges 24 was about 0.02 nm. The length of the ridges 24 and grooves 26 can arbitrarily be determined by the distance between two parallel cuts made in the carbon atom layer 11 perpendicularly to the axis α, and in this example the length was greater than 3 μm.

It is also possible to produce a striped ridge-and-groove structure after bending the carbon atom layer 11 with relatively large radii of curvature. In that case, the roundly bulging bend region, such as the bend region 20 in FIGS. 3(A) and 3(B), is further scanned with an AFM probe by raising the set-point voltage to about 5 V. As the scanning is repeated several times the bend radii gradually reduce, and consequently a striped ridge-and-groove structure appears in the bend region.

In the striped ridge-and-groove structures produced in this invention the stripe pitch P ranges from about 0.5 nm to about 1 nm, and the depth of each groove from the adjacent ridge top is about 0.02 nm.

Figure 5:
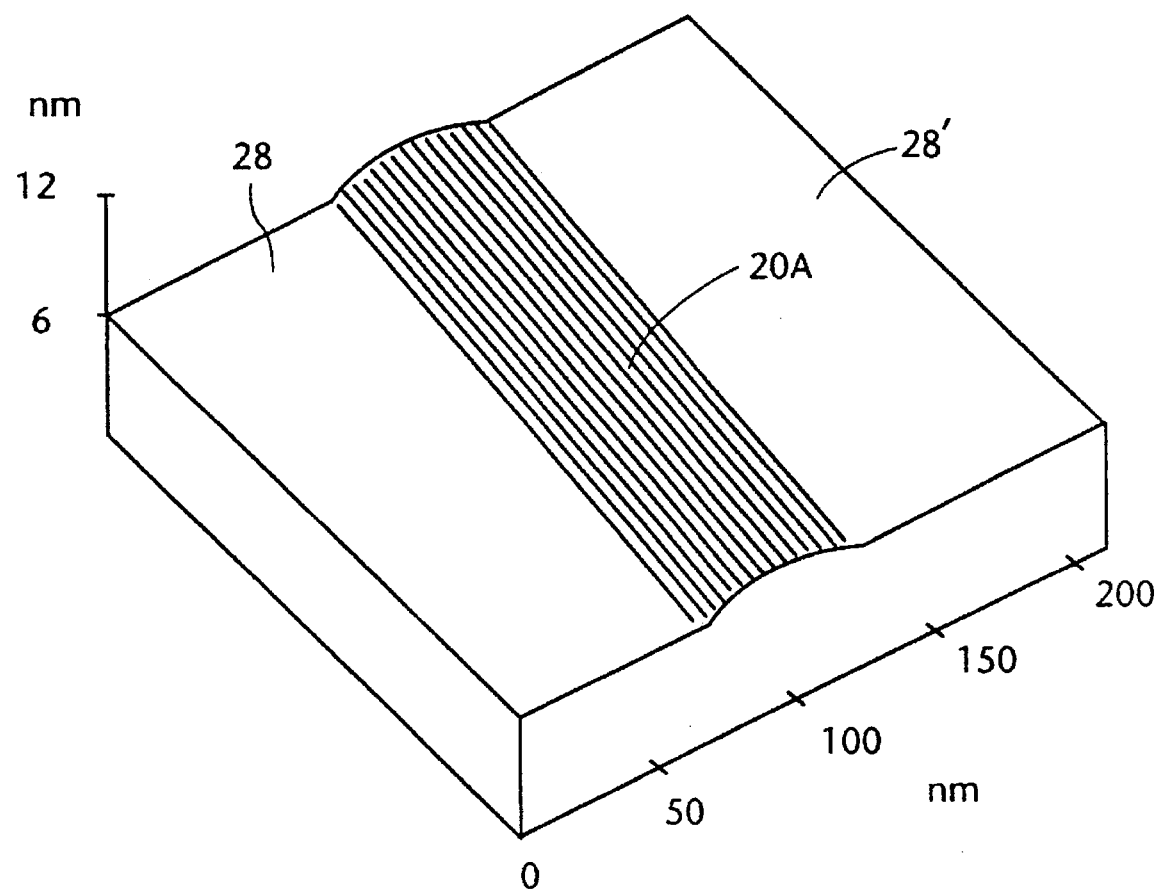
FIG. 5 is a magnified and schematic illustration of a carbon material having a ridge-and-groove structure.

In each layer of graphite carbon atoms are fundamentally in the $sp^2$ bonding state. The above described ridge-and-groove structure is considered to be linear defects in the $sp^2$ planar structure, and the defects will be attributed to the $sp^3$-like bonding state. When $sp^2$ hybrid orbitals are shifted to $sp^3$ hybrid orbitals it is natural that two carbon atoms are involved. From this fact it is understood that a structural defect involving the $sp^3$ hybrid orbitals may form a pair of bends in a graphite plane. The striped ridge-and-groove structure breaks the delocalized π-conjugated system in a graphite plane by dividing the plane into a plurality of regions and again induces a delocalized π-conjugated system in each of the divided regions. This is an important role of the ridge-and-groove structure. For example, as can be seen in FIG. 5 which is a schematic illustration based on the result of observation with AFM, in a carbon material according to the invention a belt-like bend region 20A having a striped ridge-and-groove structure (structural defects involving $sp^3$) intervenes between two planar regions 28 and 28'. Each of these three regions 20A, 28, 28' functions in the manner of an isolated one-dimensional wire.

The ridge-and-groove structure is a localized structure of which the physical properties are determined exclusively by its configuration and size, and a new band structure appears in this localized structure.

In Example 2 illustrated by FIGS. 3(A) and 3(B), the fundamental property of the nearly cylindrical region 20A of the carbon atom layer 11 could by varied from a conductor to semiconductors with various band gaps by controlling the pitch P of the striped ridge-and-groove structure. Therefore, the technique of this example may be applicable to, for example, quantum wires.

EXAMPLE 2A

The carbon material produced in Example 2 was subjected to a heat treatment in argon gas at 2500° C. for about 10 h, and the heat-treated carbon material was observed with transmission electron microscope (TEM). It was found that the both ends of the cylindrical bend region 20A were semispherically closed whereby the cylindrical form turned into an elongated polyhedron.

EXAMPLE 3

Figure 6A:
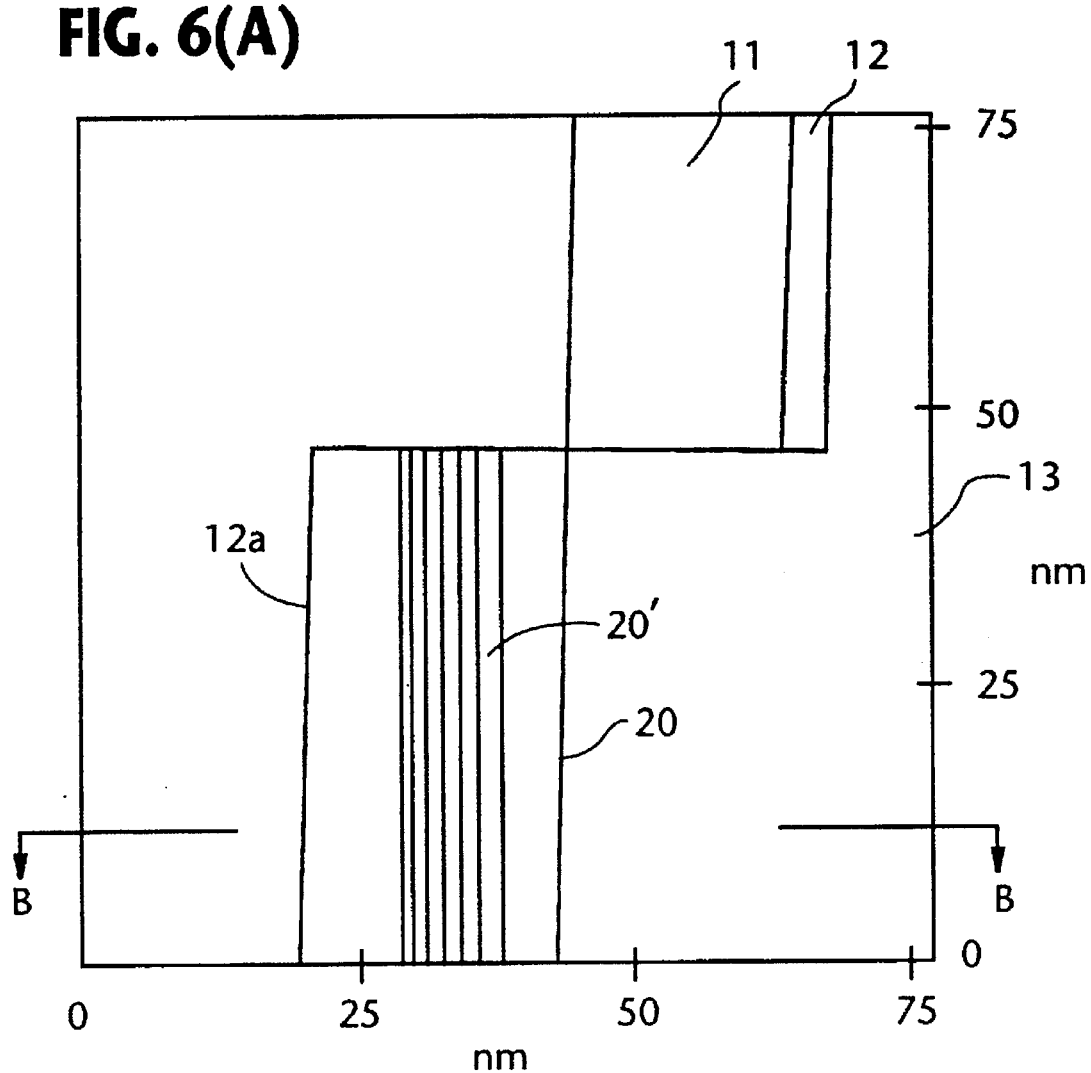
FIG. 6(A) is a magnified plan view sketch of a novel carbon material produced by bending two layers of graphite simultaneously.
Figure 6B:
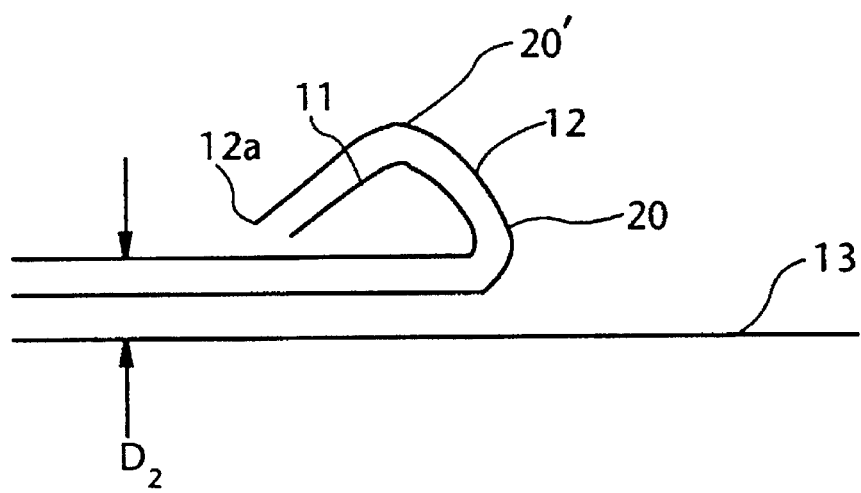
FIG. 6(B) is a sketch of the section taken along the line B—B in FIG. 6(A)

Referring to FIG. 6(A) which is a sketch of an AFM image and FIG. 6(B) which shows an elevational section, in this example two carbon atom layers of graphite, viz. the surface layer 11 and the next layer 12, were cut together so as to define a rectangular area and simultaneously bent in two belt-like regions 20 and 20'. Numeral 12a indicates an edge of the second layer 12 and numeral 13 the third carbon atom layer of graphite. The distance $D_2$ in FIG. 6(A) was 0.68 nm.

In graphite crystal, planar layers formed of hexagonally six-membered carbon atom rings are stacked with regular spacings by van der Waals forces, and the stacked planar layers have the regularity represented by ABAB . . . . That is, with respect to the planes A, the planes B are dislocated in the direction of one of the three axes α', β' and γ' in FIG. 2 by a half length of the C—C bond. When two layers are simultaneously bent, the positional relationship between the two layers remains fundamentally unchanged.

In cutting the two layers 11 and 12 together by scanning with an AFM probe, the set-point voltage is raised to about 12 V, and scanning is repeated several times. In simultaneously bending the two layers 11 and 12, the set-point voltage is made higher than in the case of bending only one layer by about 1 V, and the scanning rate is made low (1 Hz or below).

If desired it is possible to simultaneously bend more than two carbon atom layers.

EXAMPLE 4

This example illustrates a process of bending two carbon layers of graphite by first cutting and bending the first layer alone and then cutting and bending the second layer. It is possible to bend more than two layers by an analogous process.

By this process it is possible to produce a novel layer structure different from the layer structure of graphite by shifting the position of the bend line of the second layer from that of the first layer. When the position of the bend line of the second layer is arbitrarily shifted, the positional relationship between the hexagonal rings in the two bent layers has an orderness that the rings in the upper and lower layers are parallel to each other with respect to the direction of one of the three axes α', β' and γ' in FIG. 2. This is because of the periodicity existing between the two layers of graphite. Therefore, the layer structure of the two bent layers differs from the turbostratic stacking structure which lack both the regularity and orderness of the graphite structure and can be found in carbon black, amorphous carbon and glassy carbon. The novel layer structure produced by sequential bending is considered to have novel properties different from ordinary graphite and, besides the size and shape of the bend regions, to become an important factor for determining the properties of the carbon material obtained by sequential bending.

Figure 7:
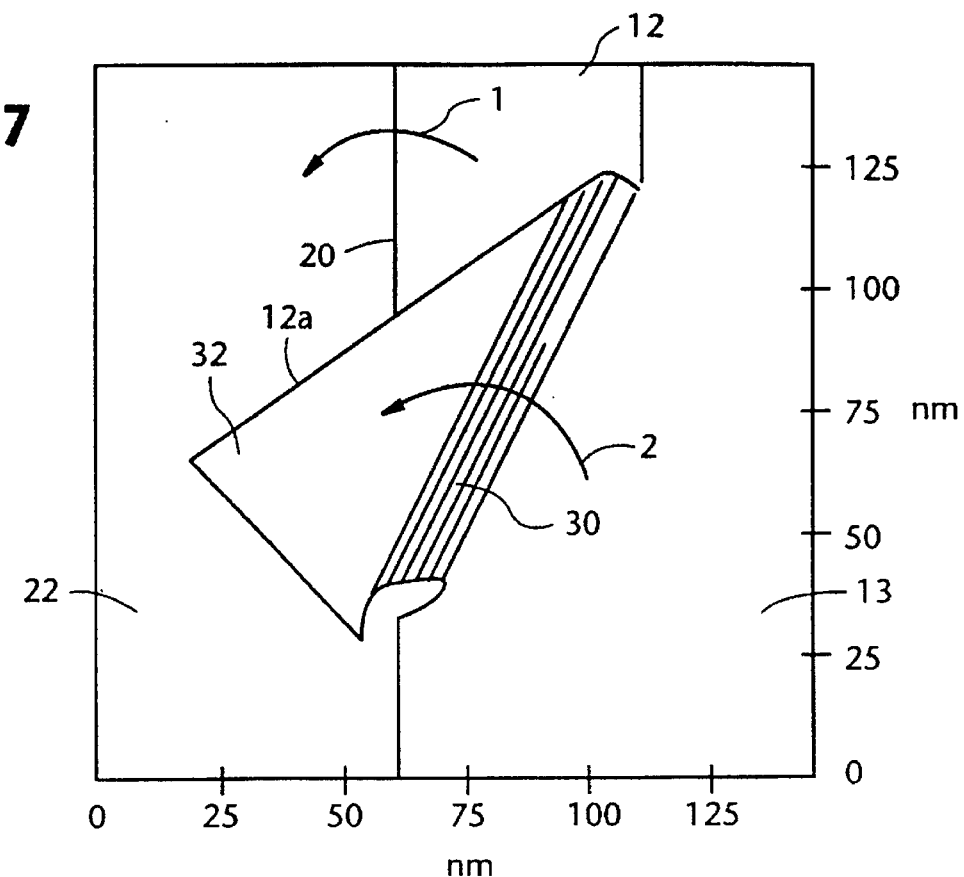
FIG. 7 is a magnified plan view sketch of a novel carbon material produced by bending two carbon atom layers of graphite individually and differently.

This example is illustrated by FIG. 7 which is a sketch of an AFM image. First, the first layer 11 of graphite was cut so as to define a rectangular area and bent in the direction of arrow 1 along a bend line 20 so as to form a rectangular flap 22 by the same method as in Example 1. Next, by the same method the second layer 12 was cut and bent in the direction of arrow 2 along a bend line which forms an angle of 30° with the first bend line 20 so as to form a triangular flap 32. As can be seen, the triangular flap 32 of the second layer and the rectangular flap 22 of the first layer are partly stacked.

If the second layer 12 is bent in the same direction as the first layer 11, a two-layer structure having a nearly cylindrical or elliptical section can be obtained.

EXAMPLE 5

Figure 8:
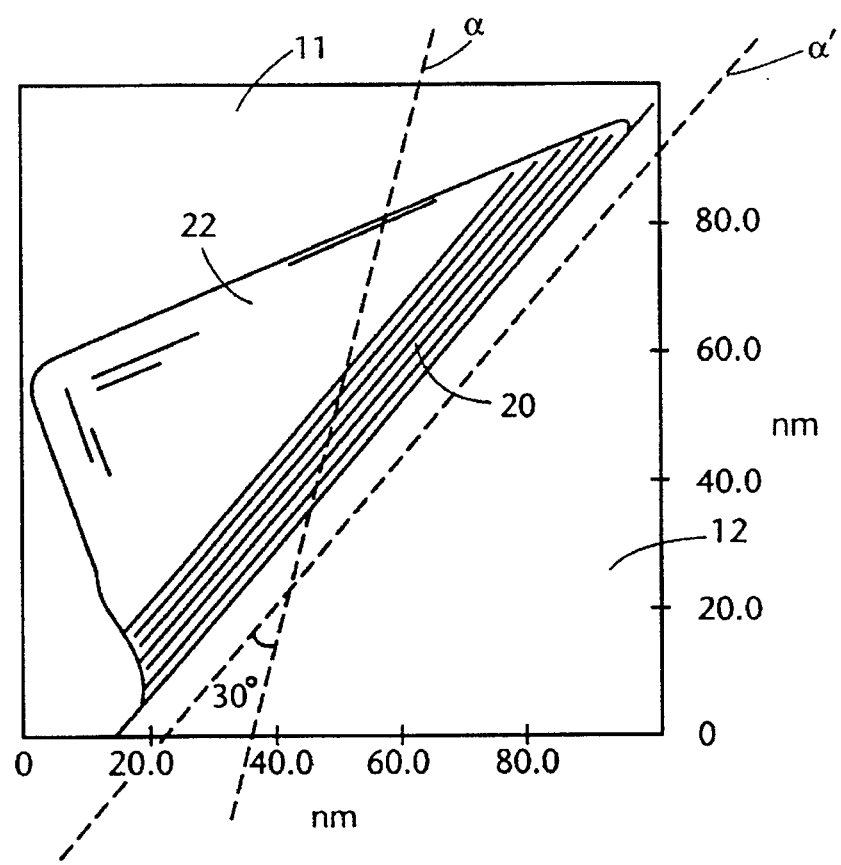
FIG. 8 is a magnified plan view sketch of a novel carbon material produced by bending a layer of graphite so as to form a triangular flap region.

Referring to FIG. 8 which is a sketch of an AFM image, a single layer 11 of graphite was bent along a line generally parallel to the axis α' (or β' or γ') in FIG. 2 so as to form a flap 22 which was triangular in plan view. That is, the layer 11 was bent along the line II in FIG. 1. In this case the roundly bulging bend region 20 had a height (H in FIG. 3B) of about 2 nm. In plan view the flap 22 was a right-angled triangle having interior angles of 30°, 60° and 90°. The carbon material of FIG. 8 has a two-dimensionally controlled shape on the order of nanometer in size and therefore is applicable, for example, to quantum dot devices.

When the carbon material of FIG. 8 was subjected to the heat treatment of Example 2A, the gap between the right-angled two edges of the flap 22 and the planar region of the graphite layer 11 were closed whereby a polygon was formed.

EXAMPLE 6

In bending a carbon atom layer of graphite so as to form a flap having a rectangular shape in plan view, there is no limitation on the length-to-width ratio of the rectangular shape.

Figure 9A:
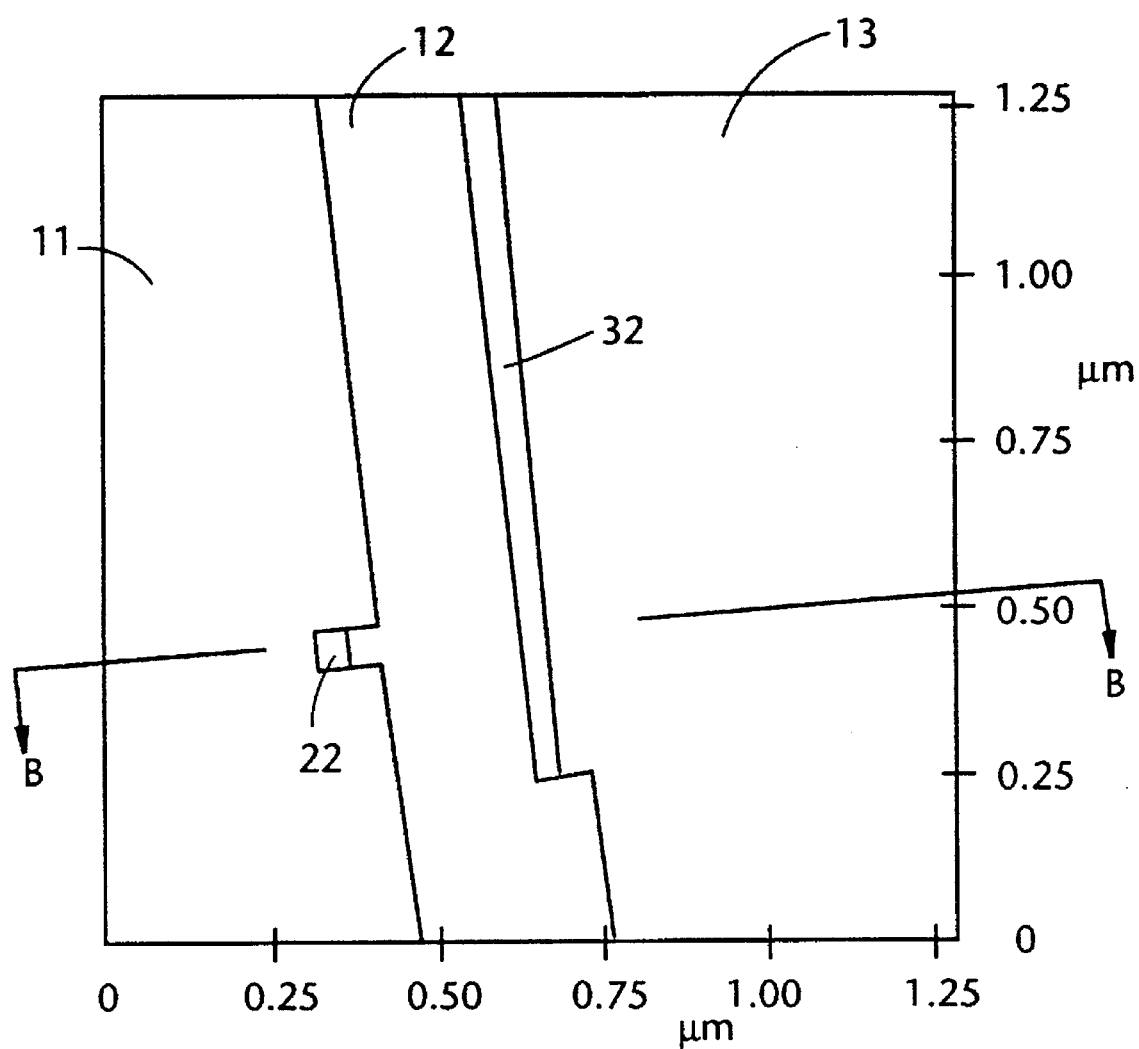
FIG. 9(A) is a magnified plan view sketch of a novel carbon material produced by bending two layers of graphite individually and differently so as to form two differently rectangular flap regions.
Figure 9B:
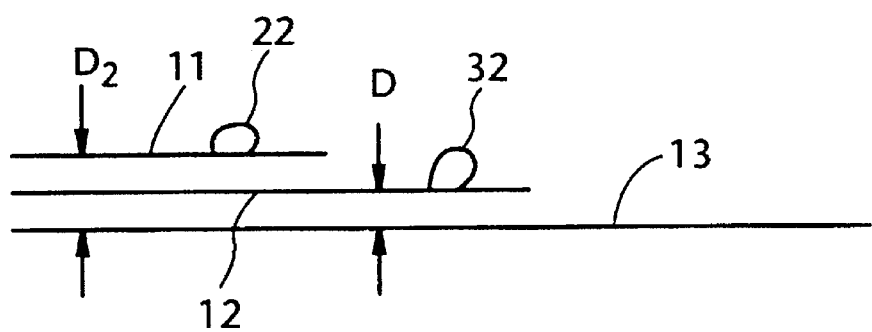
FIG. 9(B) is a sketch of the section taken along the ling B—B in FIG. 9(A)

As shown in FIGS. 9(A) and 9(B), in this example a layer 11 of graphite was bent so as to form a flap 22 having a nearly square shape in plan view, and another layer 12 was bent so as to form a flap 32 having the shape of a very elongate rectangle in plan view. The carbon material of FIGS. 9(A) and 9(B) has two-dimensionally controlled shapes on the order of nanometer in size and therefore is applicable, for example, to quantum dot devices.

When the carbon material of FIGS. 9(A) and 9(B) was subjected to the heat treatment of Example 2A, the gaps between the free edges of the rectangular flaps 22 and 32 and the planar region of the graphite layer were closed whereby polygons were formed.

EXAMPLE 7

In this invention the plan view shape of a flap formed by bending a layer of graphite is not limited to triangle and rectangle. A differently polygonal shape can be formed by jointly using the method of forming a triangular shape and the method for forming a rectangular shape, or by cutting off at least one corner region of a triangular or rectangular flap. Further, it is possible to bend a corner region of a triangular or rectangular flap to thereby form another triangular flap on the initially formed flap. Compared with the microstructure illustrated in FIG. 5 which exhibits great anisotropy in one-dimensional direction, the microstructures having more intricate shapes with polygonal flaps are expected to exhibit more interesting properties.

Figure 10:
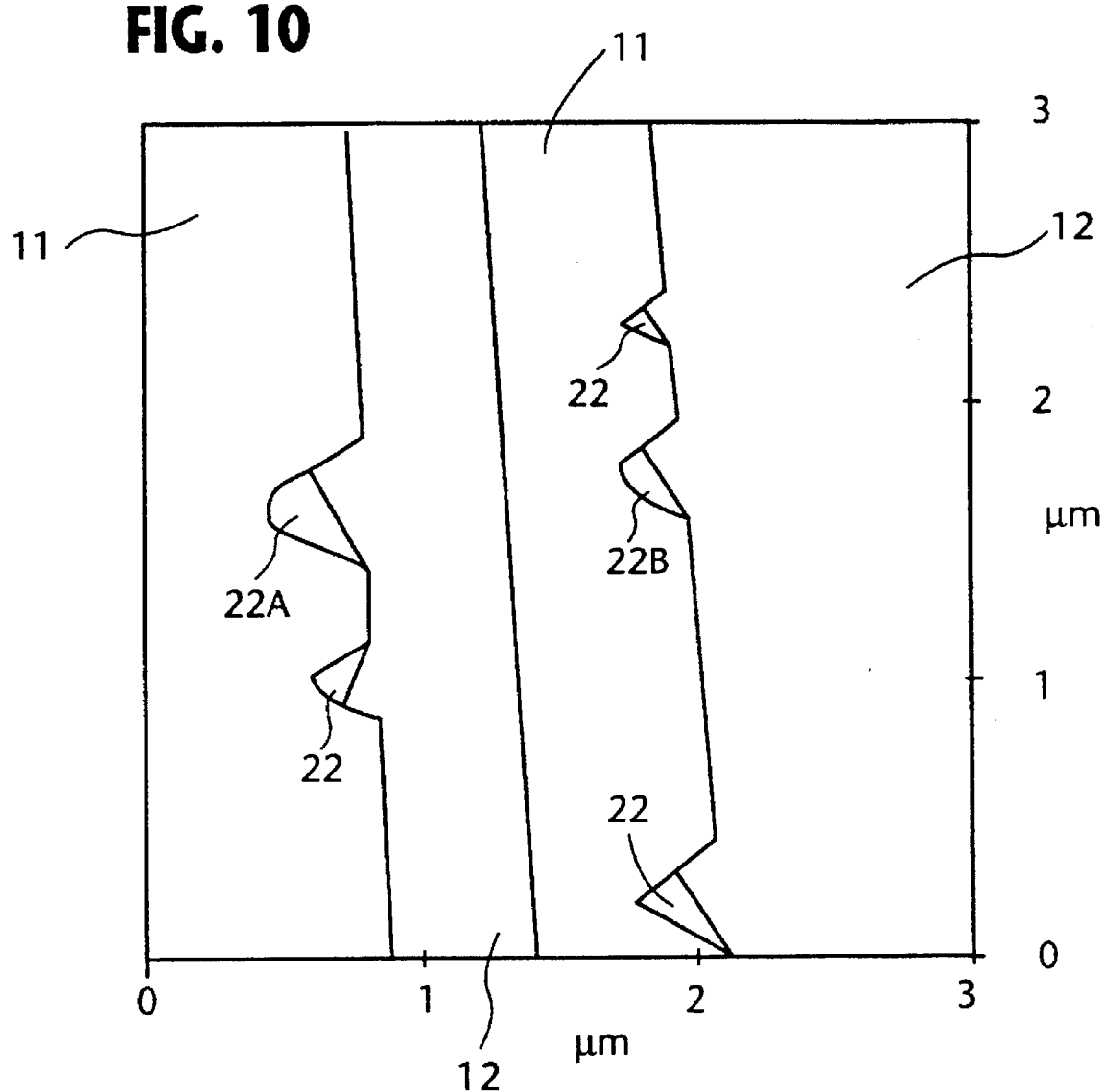
FIG. 10 shows variously polygonal flap regions formed by cutting and bending a layer of graphite.

FIG. 10 shows a flap 22A which has a pentagonal shape in plan view and another flap 22B which has a trapezoidal shape in plan view together with triangular flaps 22. The pentagonal flap 22A had interior angles of 30°, 90°, 120°, 120° and 120° and was formed for example, by first forming a triangular flap, then cutting off a corner region of that flap to thereby form a quadrilateral flap and then cutting off a corner region of the quadrilateral. The trapezoidal flap 22B was formed, for example, by first forming a rectangular (or triangular) flap and then cutting off a corner region of that flap. These various and microscopically controlled shapes will be very useful to acquire various quantum effects in view of the fact that in producing microelectronic devices using quantum wire or quantum box structures there are great differences in the electron confining effects with the shapes of the quantum structures.

It is expectable to utilize microscopic carbon materials according to the invention in various shapes in the known microfabrication techniques such as crystal growth, patterning, etching, doping, re-growth and electrode formation. For example, it is conceivable to use a carbon material according to the invention as a substrate on which a crystal of another material is grown or electrodes are formed. A carbon material according to the invention having a suitable shape may be cut out of graphite bulk to use as a masking material in an etching process. As another example, there is a possibility of patterning a graphite layer by using a method according to the invention. Furthermore, it will be possible to utilize carbon materials according to the invention in developing microminiature optoelectronic devices such as microcavity lasers and quantum wire lasers on the order of micrometer or nanometer.

What is claimed is:

1. A method of producing a carbon material, comprising the steps of:

bending at least one carbon atom layer of graphite in at least on selected region along at least one of a first line, which extends generally in the direction of a straight line connecting the middle points of two parallel sides of a hexagonal ring of carbon atoms and contains two adjacent sides of said hexagonal ring forming an angle of 30° with said straight line, and a second line which extends generally in the direction of a diagonal of said hexagonal ring and contains three adjacent sides of said hexagonal ring on one side of said diagonal by scanningly picking up said at least one carbon atom layer with a probe of a scanning microscope which is sharply pointed on the atomic level, bending step comprises bending said at least one carbon atom layer to form a flap region having a polygonal shape in a plan view.

2. The method according to claim 1, wherein said scanning microscope is an atomic force microscope.

3. The method according to claim 1, wherein said bending step comprises the step of bending at least two carbon atom layers together.

4. The method according to claim 1, wherein said bending step comprises the step of:

bending at least two carbon atom layers one after another.

5. The method according to claim 4, wherein said bending step comprises the step of bending said at least two carbon atom layers differently from one another.

6. The method according to claim 1, further comprising the step of subjecting said at least one carbon atom layer having said flap region to a heat treatment to close a gap between every free edge of said flap region and a planar region of said at least one carbon atom layer.

* * * * *